United States Patent
Saunders et al.

(10) Patent No.: US 10,085,538 B2
(45) Date of Patent: Oct. 2, 2018

(54) HAND HELD APPLIANCE

(71) Applicant: Dyson Technology Limited, Wiltshire (GB)

(72) Inventors: Samuel William Saunders, Swindon (GB); Graham Donald, Preston (GB); Ben Colin Bobillier, Bath (GB)

(73) Assignee: Dyson Technology Limited, Malmesbury, Wiltshire (GB)

( * ) Notice: Subject to any disclaimer, the term of this patent is extended or adjusted under 35 U.S.C. 154(b) by 0 days.

(21) Appl. No.: 15/297,935

(22) Filed: Oct. 19, 2016

(65) Prior Publication Data
US 2017/0112255 A1    Apr. 27, 2017

(30) Foreign Application Priority Data

Oct. 21, 2015 (GB) .................................. 1518642.2

(51) Int. Cl.
| | |
|---|---|
| A45D 20/10 | (2006.01) |
| G05D 23/30 | (2006.01) |
| H05K 5/00 | (2006.01) |
| H05K 7/14 | (2006.01) |

(52) U.S. Cl.
CPC .......... A45D 20/10 (2013.01); G05D 23/306 (2013.01); H05K 5/003 (2013.01); H05K 7/1401 (2013.01)

(58) Field of Classification Search
CPC ...... A45D 20/10; G05D 23/306; H05K 5/003; H05K 7/1401
USPC ............................... 34/96–100; 392/384–385
See application file for complete search history.

(56) References Cited

U.S. PATENT DOCUMENTS

| | | |
|---|---|---|
| 2,514,528 A | 7/1950 | Wahl |
| 3,261,107 A | 7/1966 | Ponczek et al. |
| 3,439,204 A | 4/1969 | Ponczek et al. |

(Continued)

FOREIGN PATENT DOCUMENTS

| | | |
|---|---|---|
| CN | 2819903 | 9/2006 |
| CN | 201011916 | 1/2008 |

(Continued)

OTHER PUBLICATIONS

Search Report dated Apr. 19, 2016, directed to GB Application No. 1518642.2; 1 page.

(Continued)

*Primary Examiner* — Stephen M Gravini
(74) *Attorney, Agent, or Firm* — Morrison & Foerster LLP (57) ABSTRACT

A hair care appliance including a body having an outer wall and an inner wall, a fluid flow path extending from a fluid inlet to a fluid outlet wherein the fluid outlet is at least partially defined by the inner wall, a heater for heating fluid in the fluid flow path and, a thermistor for measuring the temperature of fluid between the heater and the fluid outlet, wherein the thermistor is retained with respect to a housing and the housing forms part of the inner wall. The housing may comprise a base that engages with the inner wall. The housing may further comprise an arm wherein the arm supports the thermistor and extends radially inwards of the inner wall. The housing may comprise two arms and the thermistor is suspended between the two arms. The inner wall may comprise an aperture into which the housing is inserted.

26 Claims, 6 Drawing Sheets

(56) References Cited

U.S. PATENT DOCUMENTS

| | | | |
|---|---|---|---|
| 3,610,881 A * | 10/1971 | Stewart | F24H 3/0423 |
| | | | 219/400 |
| 4,085,309 A | 4/1978 | Godel et al. | |
| 4,260,875 A * | 4/1981 | Walter | A45D 20/12 |
| | | | 219/501 |
| 4,327,278 A | 4/1982 | Tomaro | |
| 4,395,619 A | 7/1983 | Harigai | |
| 4,550,358 A | 10/1985 | Crowley et al. | |
| 4,701,595 A | 10/1987 | Okutsu et al. | |
| 4,706,153 A | 11/1987 | Sainomoto et al. | |
| 4,711,988 A | 12/1987 | Thaler et al. | |
| 4,720,759 A | 1/1988 | Tabei | |
| 4,721,121 A | 1/1988 | Adams | |
| 4,767,914 A | 8/1988 | Glucksman | |
| 5,434,946 A | 7/1995 | Barzilai et al. | |
| 5,448,677 A | 9/1995 | Fell et al. | |
| 5,612,849 A | 3/1997 | Prehodka et al. | |
| 5,642,570 A * | 7/1997 | Lee | A45D 19/16 |
| | | | 34/98 |
| 5,651,190 A * | 7/1997 | Sanders | A45D 20/18 |
| | | | 34/101 |
| 5,857,262 A | 1/1999 | Bonnema et al. | |
| 6,191,930 B1 | 2/2001 | Ramchandani | |
| 6,285,828 B1 | 9/2001 | Cafaro | |
| 6,640,049 B1 | 10/2003 | Lee et al. | |
| 6,895,686 B1 | 5/2005 | Sabbatini | |
| 7,644,511 B2 | 1/2010 | Ishikawa et al. | |
| 7,748,343 B2 | 7/2010 | Kim et al. | |
| 8,015,724 B2 | 9/2011 | Imahori et al. | |
| 8,434,238 B2 * | 5/2013 | Gross | A45D 20/12 |
| | | | 132/212 |
| 9,420,865 B2 | 8/2016 | Gammack et al. | |
| 9,510,395 B2 * | 11/2016 | Coulton | A45D 20/38 |
| 9,526,310 B2 | 12/2016 | Courtney et al. | |
| 9,693,616 B2 * | 7/2017 | Sakuma | A45D 20/12 |
| 9,756,922 B1 * | 9/2017 | Duthe | A45D 20/12 |
| 2006/0098962 A1 | 5/2006 | Ceva | |
| 2007/0119069 A1 | 5/2007 | Shim | |
| 2007/0204477 A1 | 9/2007 | Lin | |
| 2008/0229606 A1 | 9/2008 | Hirai | |
| 2010/0162585 A1 * | 7/2010 | Liu | A45D 20/12 |
| | | | 34/97 |
| 2010/0286754 A1 | 11/2010 | Bly | |
| 2012/0126041 A1 | 5/2012 | Nunomura et al. | |
| 2014/0255173 A1 | 9/2014 | Poulton et al. | |
| 2015/0007855 A1 * | 1/2015 | Moloney | A45D 20/10 |
| | | | 132/271 |
| 2015/0093099 A1 | 4/2015 | Shelton et al. | |
| 2016/0220004 A1 * | 8/2016 | Moloney | A45D 20/10 |
| 2017/0112255 A1 * | 4/2017 | Saunders | A45D 20/10 |
| 2017/0112256 A1 | 4/2017 | Bobillier et al. | |
| 2017/0112257 A1 | 4/2017 | Bobillier et al. | |
| 2017/0112258 A1 | 4/2017 | Blanc et al. | |
| 2017/0150798 A1 | 6/2017 | Bobillier et al. | |
| 2017/0164709 A1 * | 6/2017 | Laveni | A45D 20/10 |

FOREIGN PATENT DOCUMENTS

| | | | |
|---|---|---|---|
| DE | 27 27 940 | 12/1977 | |
| DE | 198 35 791 | 2/1999 | |
| EP | 0 518 035 | 12/1992 | |
| EP | 1 433 401 | 6/2004 | |
| EP | 1 527 709 | 5/2005 | |
| EP | 1 836 919 | 9/2007 | |
| EP | 1 956 317 | 8/2008 | |
| EP | 2 138 065 | 12/2009 | |
| EP | 2 161 511 | 3/2010 | |
| EP | 2 308 337 | 4/2011 | |
| FR | 1.217.860 | 5/1960 | |
| GB | 684341 | 12/1952 | |
| GB | 2 023 351 | 12/1979 | |
| GB | 2 048 627 | 12/1980 | |
| GB | 2543537 | 4/2017 | |
| IT | 1255589 | 11/1995 | |
| JP | 51-153187 | 5/1975 | |
| JP | 53-95457 | 8/1978 | |
| JP | 60-75007 | 4/1985 | |
| JP | 60-182913 | 12/1985 | |
| JP | 61-75202 | 5/1986 | |
| JP | 61-157402 | 9/1986 | |
| JP | 61-157403 | 9/1986 | |
| JP | 61-217648 | 9/1986 | |
| JP | 1-291059 | 11/1989 | |
| JP | 2-252405 | 10/1990 | |
| JP | 3-111002 | 5/1991 | |
| JP | 4-105603 | 4/1992 | |
| JP | 4-338406 | 11/1992 | |
| JP | 5-293010 | 11/1993 | |
| JP | 6-54713 | 3/1994 | |
| JP | 6-78826 | 3/1994 | |
| JP | 7-213330 | 8/1995 | |
| JP | 7-313239 | 12/1995 | |
| JP | 8-47415 | 2/1996 | |
| JP | 8-299048 | 11/1996 | |
| JP | 11-76390 | 3/1999 | |
| JP | 3116053 | 11/2005 | |
| JP | 2006-236707 | 9/2006 | |
| JP | 3130650 | 4/2007 | |
| JP | 2013-22251 | 2/2013 | |
| JP | 2013-231610 | 11/2013 | |
| JP | 2015-13123 | 1/2015 | |
| JP | 2015-66446 | 4/2015 | |
| JP | 2015-73726 | 4/2015 | |
| JP | 2016112424 A * | 6/2016 | ............. A45D 20/10 |
| JP | 2017018593 A * | 1/2017 | ........... A45D 20/122 |
| JP | 2017-77471 | 4/2017 | |
| JP | 2017-77472 | 4/2017 | |
| WO | WO-95/31915 | 11/1995 | |
| WO | WO-2004/019726 | 3/2004 | |
| WO | WO-2004/064565 | 8/2004 | |
| WO | WO-2017/068321 | 4/2017 | |

OTHER PUBLICATIONS

International Search Report and Written Opinion dated Dec. 16, 2016, directed to International Application No. PCT/GB2016/053016; 10 pages.

Bobillier et al., U.S. Office Action dated Sep. 22, 2017, directed to U.S. Appl. No. 15/297,847; 9 pages.

Bobillier et al., U.S. Office Action dated Sep. 19, 2017, directed to U.S. Appl. No. 15/297,932; 8 pages.

* cited by examiner

HAND HELD APPLIANCE

REFERENCE TO RELATED APPLICATIONS

This application claims the priority of United Kingdom Application No. 1518642.2, filed Oct. 21, 2015, the entire contents of which are incorporated herein by reference.

FIELD OF THE INVENTION

This invention relates to a handheld appliance and in particular a hair care appliance such as a hairdryer.

BACKGROUND OF THE INVENTION

Generally, a motor and fan are provided which draw fluid into a body; the fluid may be heated prior to exiting the body. The motor is susceptible to damage from foreign objects such as dirt or hair so conventionally a filter is provided at the fluid inlet to the blower. The fan and heater require power in order to function and this is provided via internal wiring from either a mains power cable or batteries attached to the appliance.

Conventional hairdryers have control buttons which can change one or more of the flow rate and the temperature of the fluid that exits the hairdryer. However, if the flow rate is increased there is usually a drop in the temperature of the fluid that exits the hairdryer that can be perceived by the user.

The temperature of the fluid that exits the hairdryer is also affected by other factors. There can be an electrical failure of some sort; alternatively dust and dirt can be pulled into the heater element and if this builds up it can burn and cause an increase in the temperature of the fluid exiting the hairdryer. Obviously, thermal protection is provided in the form of thermal cut outs such as thermal fuses or bi-metallic strips to prevent an excessive increase in temperature but such protection renders the hairdryer inoperable either temporarily or permanently.

It would be desirable to monitor the temperature and account for thermal fluctuations either due to a change in the flow rate or due to another factor. This provides a better user experience as changes in temperature when the flow rate is changed are minimised. Also, an increase in the temperature without a change in the set flow rate could be used to highlight a possible later problem and prevent the hairdryer becoming inoperable even if for only a short period of time.

SUMMARY OF THE INVENTION

According to a first aspect, the invention provides hair care appliance comprising a body having an outer wall and an inner wall, a fluid flow path extending from a fluid inlet to a fluid outlet wherein the fluid outlet is at least partially defined by the inner wall, a heater for heating fluid in the fluid flow path and, a thermistor for measuring the temperature of fluid between the heater and the fluid outlet, wherein the thermistor is retained with respect to a housing and the housing forms part of the inner wall.

Having the thermistor downstream of the heater is advantageous compared to having it located within the heater as the thermistor measures the exit temperature of the heater rather than an internal temperature. So, for example if a hot spot is produced within the heater due to an accumulation of dirt and dust this would only be measured if it was located upstream of the thermistor thus, the entire heater is not monitored.

Preferably, the housing comprises a base that engages with the inner wall.

It is preferred that the housing further comprises an arm wherein the arm supports the thermistor and extends radially inwards of the inner wall.

Preferably, the housing comprises two arms and the thermistor is suspended between the two arms. By suspending the thermistor, it is surrounded by the fluid flow so it is not insulated or shielded from the fluid flow and will therefore give a more accurate measure of the actual temperature.

It is preferred that the inner wall comprises an aperture into which the housing is inserted. This feature is useful for a number of reasons: manufacture is simplified; and repeatability of the positioning of the thermistor is assured for example.

Preferably, the inner wall comprises a flange which extends at least partially around the aperture.

It is preferred that the base of the housing comprises a lip which extends radially around the base for engagement with the flange when the housing is positioned correctly with respect to the inner wall. This means that the radial positioning of the thermistor within the heated flow is reliably repeated.

Preferably, the aperture comprises a stop feature for engagement with the housing when the housing is positioned correctly within the inner wall.

It is preferred that the stop feature is a recess provided in a wall that defines the aperture.

Preferably, the housing comprises a cooperating stop feature for engagement with the inner wall when the housing is positioned correctly within the inner wall.

It is preferred that the base of the housing comprises a strut adapted to extend into the aperture and the strut comprises the cooperating stop feature.

Preferably, the cooperating stop feature comprises a protrusion adapted to fit within the aperture.

It is preferred that the strut extends between a pair of arms that extend from the base of the housing.

Preferably, the thermistor is electrically connected to a control circuit via wiring which extends within the housing.

It is preferred that the wiring extends from the housing to a printed circuit board (PCB) and the wiring is connected to the PCB via a connector.

Preferably, the heater comprises a heater element and a wall which extends radially around the outer periphery of the heater element. This wall is preferably made from an insulating material such as Mica.

It is preferred that the wiring extends along an outer periphery of the wall to the PCB. The wall thermally insulates the wiring.

Preferably, the inner wall comprises a pair of lips which extend around the inner wall at a distal end of the inner wall from the fluid outlet.

It is preferred that the pair of lips is adapted to engage with the wall.

Preferably, the inner wall comprises at least one channel for accommodating the wiring, the at least one channel extending from an end of the inner wall distal from the fluid outlet. This both locates the wiring in a repeatable and known position and it allows the wiring to be recessed into the inner wall providing a degree of protection during manufacture and assembly and a small space saving.

It is preferred that the at least one channel extends from an aperture in the inner wall wherein said aperture retains the housing within the inner wall.

Preferably, the PCB is housed within the body and between the PCB and the heater a baffle is provided.

It is preferred that the baffle comprises a channel for guiding the wiring along a surface of the baffle. This both locates the wiring in a repeatable and known position and it allows the wiring to be recessed into the inner wall providing a degree of protection during manufacture and assembly and a small space saving.

Preferably, the baffle comprises a retaining clip for retaining the wiring within the channel.

It is preferred that the retaining clip extends at least partially across the channel.

Preferably, the appliance is a hairdryer.

BRIEF DESCRIPTION OF THE DRAWINGS

The invention will now be described, by way of example only, with reference to the accompanying drawings, in which.

DETAILED DESCRIPTION OF THE INVENTION

Figure 1:
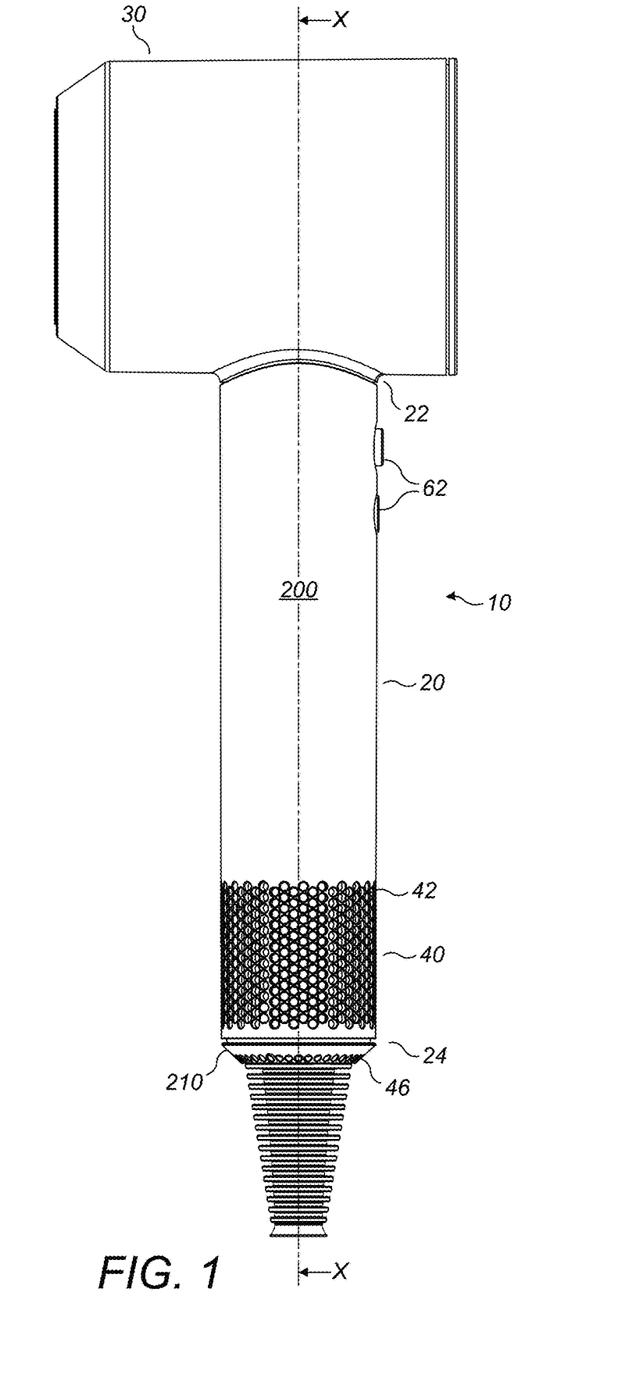
FIG. 1 shows a hairdryer in which a thermistor according to the invention may be used.
Figure 2:
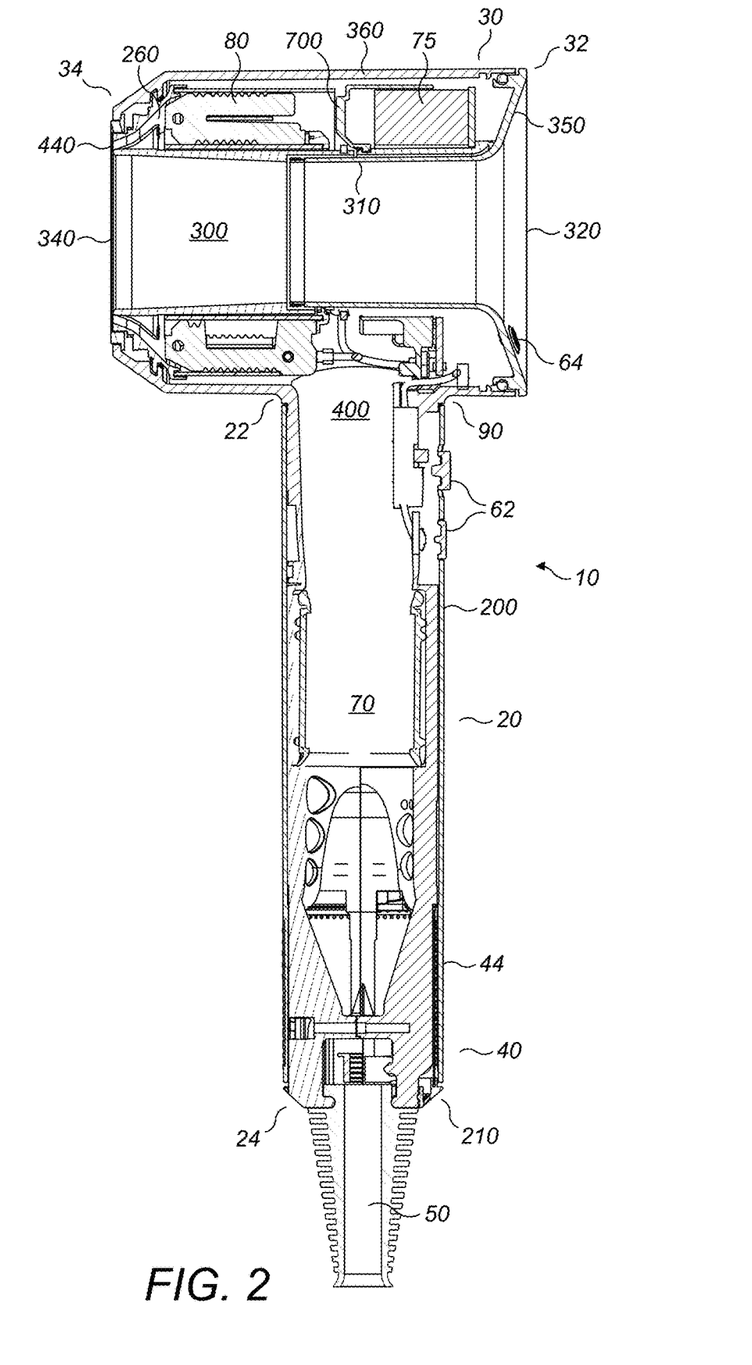
FIG. 2 shows a cross section through the hairdryer of FIG. 1.

FIGS. 1 and 2 show an example of hairdryer 10 with a handle 20 and a body 30 suitable for use with a thermistor according to the invention. The handle has a first end 22 which is connected to the body 30 and a second end 24 distal from the body 30 and which includes a primary fluid inlet 40. Power is supplied to the hairdryer 10 via a cable 50. At a distal end of the cable 50 from the hairdryer 10 a plug (not shown) is provided, the plug may provide electrical connection to mains power or to a battery pack for example.

The handle 20 has an outer wall 200 which extends from the body 30 towards a distal end 24 of the handle. At the distal end 24 of the handle an end wall 210 extends across the outer wall 200. The cable 50 enters the hairdryer through this end wall 210. The primary fluid inlet 40 in the handle 20 includes first apertures that extend around and along 42 the outer wall 200 of the handle in a series of rows and/or columns that extend from the distal end 24 of the handle 20 and second apertures that extend across 46 and through the end wall 210 of the handle 20. The first and second apertures form an initial filter for the primary fluid inlet and help to prevent hair and other foreign objects from entering. Ideally, a second finer filter 44 is provided. The cable 50 is located approximately in the middle of the end wall 210 so extends from the centre of the handle 20. The handle 20 has a longitudinal axis X-X along which the outer wall 200 extends from the body 30 towards the distal end 24.

Upstream of the primary fluid inlet 40, a fan unit 70 is provided. The fan unit 70 includes a fan and a motor. The fan unit 70 draws fluid through the primary fluid inlet 40 towards the body 30 through a primary fluid flow path 400 that extends from the primary fluid inlet 40 and into the body 30 where the handle 20 and the body 30 are joined 90. The body 30 has a first end 32 and a second end 34, the primary fluid flow path 400 continues through the body 30 towards the second end 34 of the body, around a heater 80 and to a primary fluid outlet 440 where fluid that is drawn in by the fan unit exits the primary fluid flow path 400. The primary fluid flow path 400 is non-linear and flows through the handle 20 in a first direction and through the body 30 in a second direction which is orthogonal to the first direction.

The body 30 includes an outer wall 360 and an inner duct 310. The primary fluid flow path 400 extends along the body from the junction 90 of the handle 20 and the body 30 between the outer wall 360 and the inner duct 310 towards the primary fluid outlet 440 at the second end 34 of the body 30.

An inner wall 260 extends within the outer wall 360. The inner wall 260 at least partially defines the primary fluid outlet 440 and extends from the second end 34 of the body 30 between the inner duct 310 and the outer wall 360.

Another fluid flow path is provided within the body; this flow is not directly processed by the fan unit or the heater but is drawn into the hairdryer by the action of the fan unit producing the primary flow through the hairdryer. This fluid flow is entrained into the hairdryer by the fluid flowing through the primary fluid flow path 400.

The first end 32 of the body includes a fluid inlet 320 and the second end 34 of the body includes a fluid outlet 340. Both the fluid inlet 320 and the fluid outlet 340 are at least partially defined by the inner duct 310 which is an inner wall of the body 30 and extends within and along the body. A fluid flow path 300 extends within the inner duct 310 from the fluid inlet 320 to the fluid outlet 340. At the first end 32 of the body 30, a side wall 350 extends between the outer wall 360 and the inner duct 310. This side wall 350 at least partially defines the fluid inlet 320. The primary fluid outlet 440 is annular and surrounds the fluid flow path.

A PCB 75 including the control electronics for the hairdryer is located in the body 30 near the side wall 350 and fluid inlet 320. The PCB 75 is ring shaped and extends round the inner duct 310 between the inner duct 310 and the outer wall 360. The PCB 75 is in fluid communication with the primary fluid flow path 400. The PCB 75 extends about the fluid flow path 300 and is isolated from the fluid flow path 300 by the inner duct 310.

The PCB 75 controls parameters such as the temperature of the heater 80 and the speed of rotation of the fan unit 70. Internal wiring (not shown) electrically connects the PCB 75 to the heater 80 and the fan unit 70 and the cable 50. Control buttons 62, 64 are provided and connected to the PCB 75 to enable a user to select from a range of temperature settings and flow rates for example.

Downstream of the PCB 75, is the heater 80 and a PCB baffle 700 is provided between the PCB 75 and the heater 80. The PCB baffle provides thermal protection for the PCB 75 when the heater 80 switched on amongst other things.

In use, fluid is drawn into the primary fluid flow path 400 by the action of the fan unit 70, is optionally heated by the heater 80 and exits from the primary fluid outlet 440. This processed flow causes fluid to be entrained into the fluid flow path 300 at the fluid inlet 320. The fluid combines with the processed flow at the second end 34 of the body. In the example shown in FIG. 2, the processed flow exits the primary fluid outlet 440 and the hairdryer as an annular flow which surrounds the entrained flow that exits from the hairdryer via the fluid outlet 340. Thus fluid that is processed by the fan unit and heater is augmented by the entrained flow.

Figure 4:
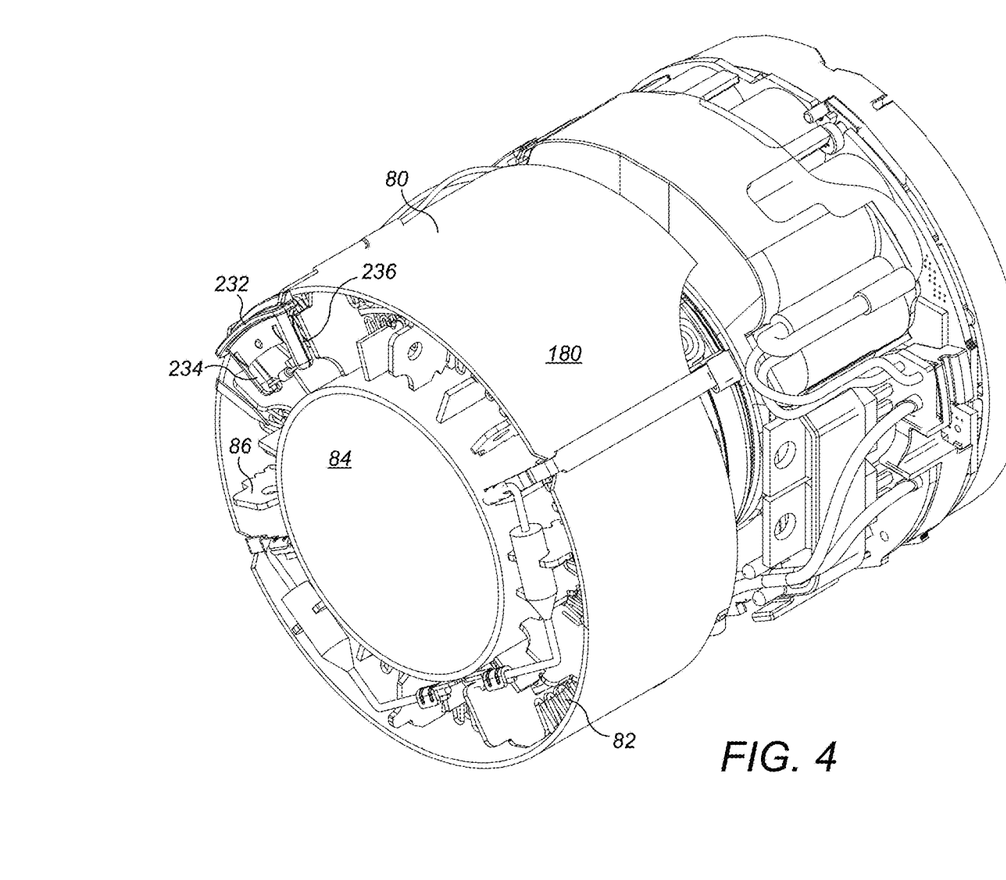
FIG. 4 shows a front isometric view of the thermistor of FIG. 3 in situ with respect to a heater assembly.

FIG. 4 shows, the heater 80 having a wall 180 which surrounds the heater element 82 and extends around the external periphery of the heater element 82 providing some thermal protection to the outer wall 360 of the body 30 of the hairdryer 10. The heater element 82 is supported by a scaffold consisting of an inner tube 84 and a plurality of supporting struts 86 which extend radially between the inner tube 84 and the wall 180 and around which the heater element 82 is wound.

In the event of a blockage either to the fluid inlet 40 or the fluid outlet 440 of the hairdryer 10, the heater element 82 could overheat as fluid flow over the heater element 82 would be restricted. To prevent this, a number of safety features are provided.

Referring now to FIGS. 3, 4, 5, 6a and 6b a thermistor 220 is retained with respect to a housing 230. The housing 230 has a base 232 and two arms 234, 236 that extend from the base 232. The thermistor 220 is supported at each end by one of the two arms 234, 236. Electrical wiring 222 that connects the thermistor to a heater control circuit (not shown) is routed through the two arms 234, 236 and out of the base 232 to a connector 224 which connects to the PCB 75.

In order that the thermistor 220 is reliably positioned with respect to the inner wall 260, the housing 230 forms part of the inner wall 260. The housing 230 and inner wall 260 are provided with cooperating features that indicate when the correct position is reached. The inner wall 260 has an aperture 270 into which the housing 230 is inserted. The aperture 270 is defined by a wall 274 which contains a recess 276. An external surface of the aperture 270 is defined by a flange 272 which extends, in this example around three sides of the aperture 270.

Figure 3:
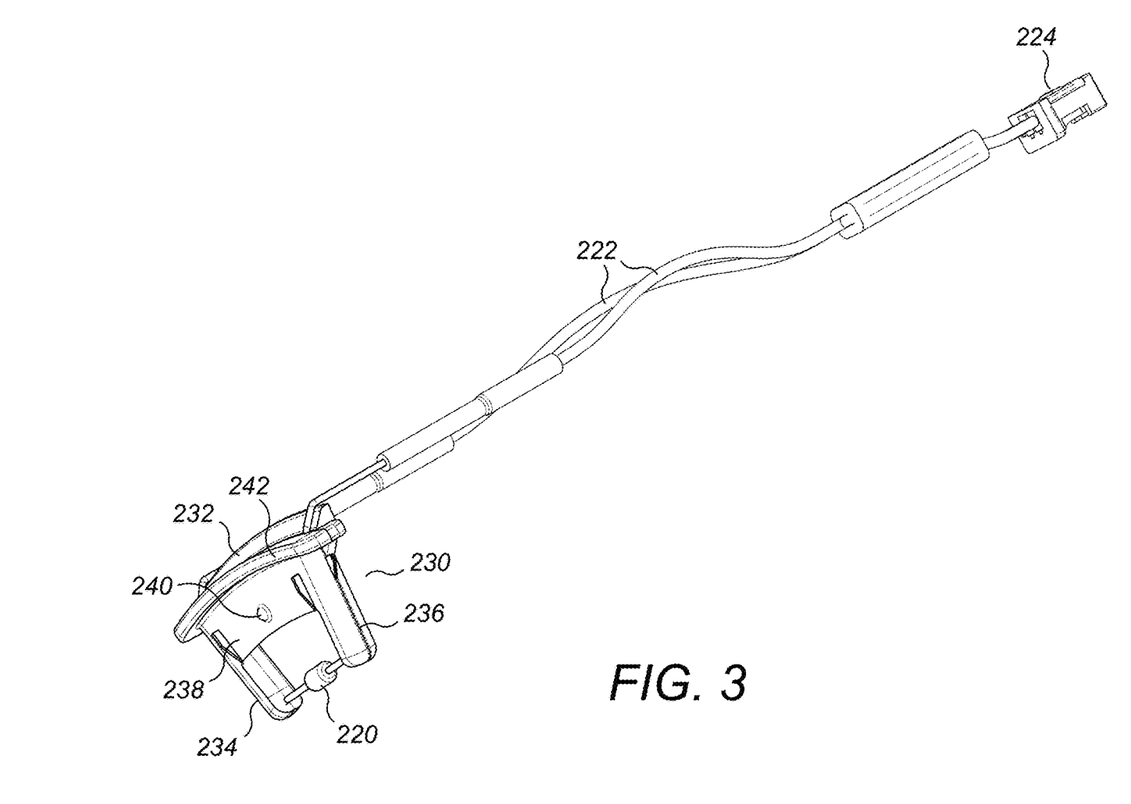
FIG. 3 shows an isometric view of a thermistor according to the invention.
Figure 6A:
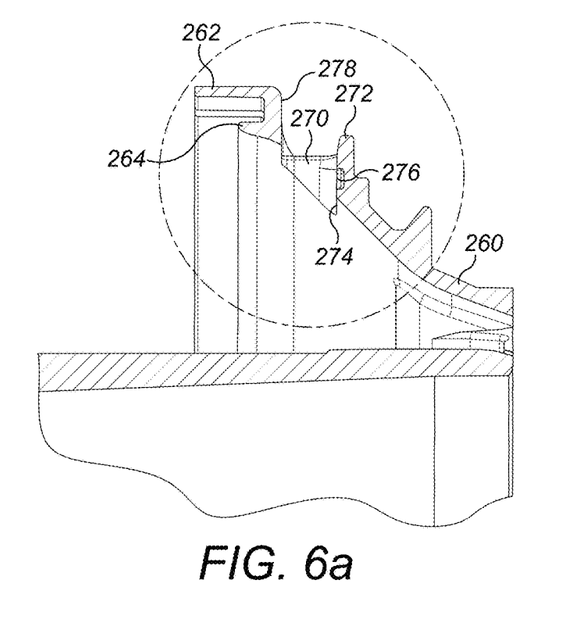
FIG. 6a shows a partial cross section through the inner wall of the body of the hairdryer of FIG. 1.
Figure 6B:
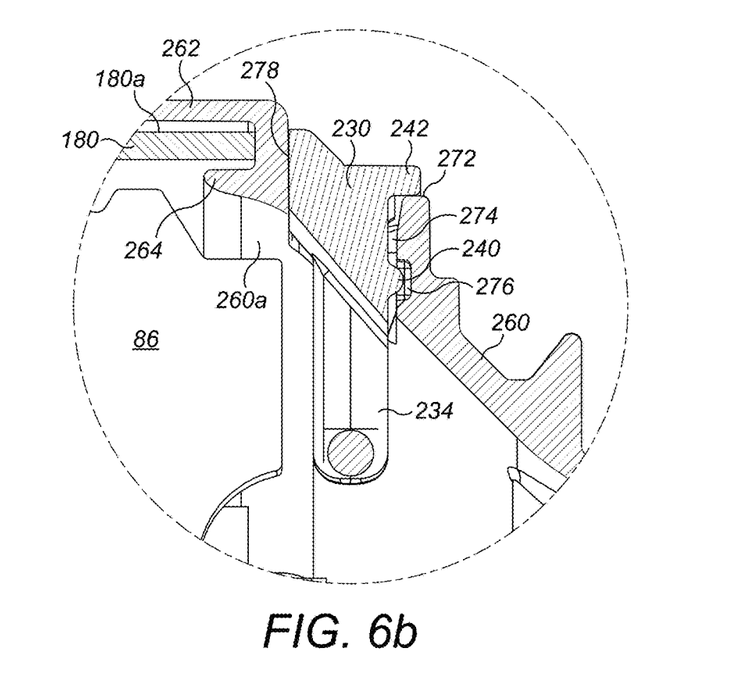
FIG. 6b shows a partial cross section through the inner wall showing the thermistor in position.

The base 230 includes a lip 242 which extends, in this case, around three sides of the base 230. The lip 242 is designed to engage with the flange 272. The fourth side of the aperture 270 is defined by a wall 278 that extends orthogonally from the flange 272 thus, the housing 230 can only be inserted into the aperture 270 in one orientation.

The housing 230 includes a strut 238 which extends from the base 232 between the two arms 234, 236. This strut 238 includes a stop feature, in this case a protrusion 240. The protrusion 240 is positioned such that when the housing 230 is correctly located with respect to the inner wall 260 the protrusion 240 engages with the recess 276 provided in the wall 274 of the aperture 270.

The thermistor 220 has a resistance which changes with temperature so is used to provide a feedback of the actual exit temperature of the heater 80. Along with the user selected heat and power levels, other factors such as the state of the filter i.e. how dirty the filter is will affect the actual temperature downstream of the heater 80. The thermistor 220 is positioned within the fluid flow path that exits from the heater 80 and is suspended in the fluid flow path. This is beneficial as the thermistor 220 is open to the fluid flowing past rather than being shielded by a part of the heater structure.

Figure 5:
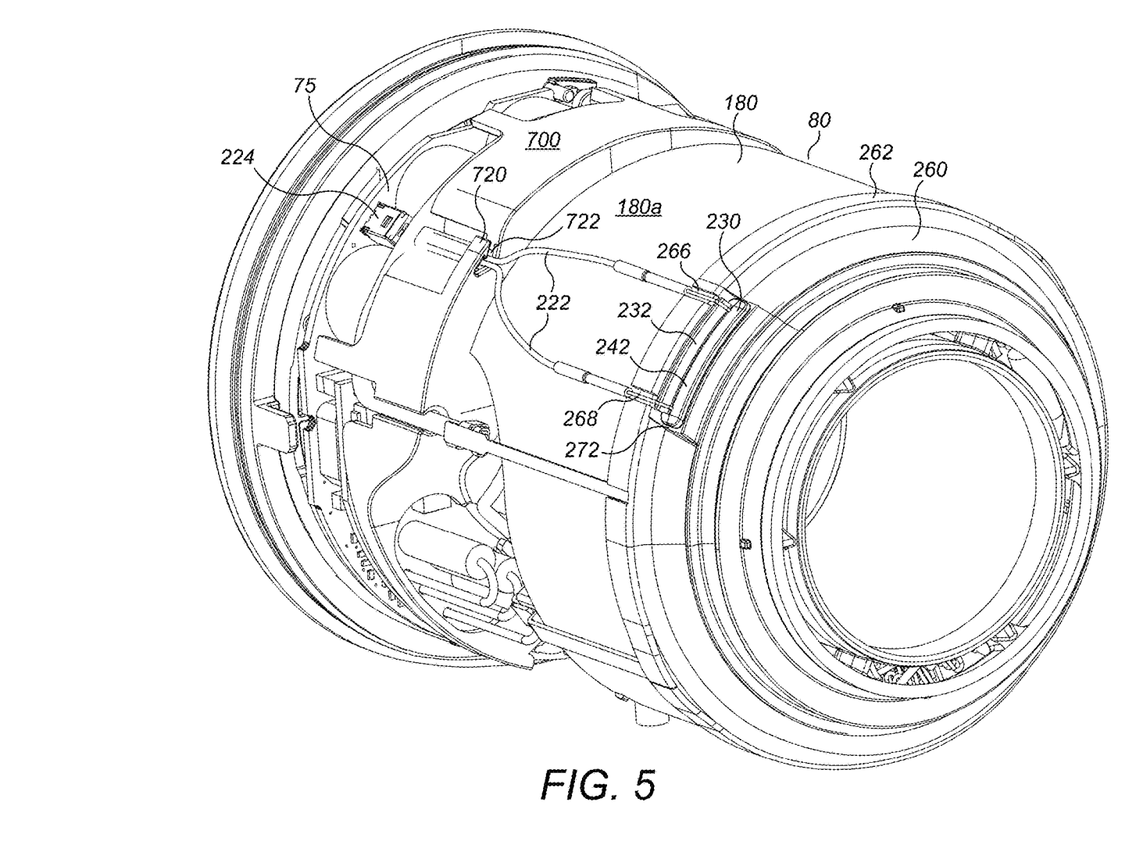
FIG. 5 shows a front isometric view of the thermistor of FIG. 3 in situ with respect to the internal structure of the hairdryer body.

In order that the thermistor 220 can be reliably and repeatedly positioned within the fluid flow path 400 and with respect to the heater 80, the inner wall 260 engages with the heater 80. The inner wall 260 has a pair of lips 262, 264 that extend towards the heater 80 and into which the outer wall 180 of the heater 80 is inserted. A radially inner surface 260a of the inner wall 260 directs the fluid that exits the heater 80 towards the fluid outlet 440.

The radially outer lip 262, extends over the outer surface 180a of the wall 180 and includes a pair of recesses or cut-outs 266, 268 for accommodating the wiring 222. Downstream of the pair of recesses or cut-outs 266, 268 an aperture 270 is provided in the inner wall 260.

Thus, the housing 230 is reliably positioned with respect to the inner wall 260 and the inner wall 260 is repeatedly positioned with respect to the heater 80, providing a reliable positioning of the thermistor 220 within the fluid flow path 400 for measurement of the temperature of fluid flowing downstream of the heater 80.

The wiring 222 is additionally supported by the PCB baffle 700 via a resilient clip 720 which extends over a recess 722 located at the downstream end of the PCB baffle 700. The wiring 222 is pushed passed and under the resilient clip 720 into the recess 722 where it remains unless pushed back out.

The pair of recesses or cut-outs 266, 268 in the inner wall 260 provide a channel for the wiring 222, in which the wiring 222 is at least partially recessed as the wiring 222 travels across from the outer wall 180 of the heater 80 into the housing 230 for the thermistor 220. This reduces the amount of space required to accommodate the wires and provides some protection when the heater is assembled into the hairdryer.

The invention has been described in detail with respect to a hairdryer however, it is applicable to any appliance that draws in a fluid and directs the outflow of that fluid from the appliance.

The fluid that flows through the appliance is generally air, but may be a different combination of gases or gas and can include additives to improve performance of the appliance or the impact the appliance has on an object the output is directed at for example, hair and the styling of that hair.

The invention is not limited to the detailed description given above. Variations will be apparent to the person skilled in the art. In particular, the heater may be a conventional heater which is trapezoid in shape and wound around a frame formed into a cross shape.

The invention claimed is:

1. A hair care appliance comprising a body having an outer wall and an inner wall, a fluid flow path extending from a fluid inlet to a fluid outlet wherein the fluid outlet is at least partially defined by the inner wall, a heater for heating fluid in the fluid flow path, and a thermistor for measuring the temperature of fluid between the heater and the fluid outlet, wherein the thermistor is retained with respect to a housing and the housing forms part of the inner wall, and wherein the housing comprises a base and an arm extending from the base and the thermistor is supported by the arm.

2. The appliance of claim 1, wherein the base engages with the inner wall.

3. The appliance of claim 2, wherein the arm extends radially inwards of the inner wall.

4. The appliance of claim 3, wherein the housing comprises two arms and the thermistor is suspended between the two arms.

5. The appliance of claim 1, wherein the inner wall comprises an aperture into which the housing is inserted.

6. The appliance of claim 5, wherein the inner wall comprises a flange which extends at least partially around the aperture.

7. The appliance of claim 6, wherein the base of the housing comprises a lip which extends radially around the base for engagement with the flange when the housing is positioned correctly with respect to the inner wall.

8. The appliance of claim 5, wherein the aperture comprises a stop feature for engagement with the housing when the housing is positioned correctly within the inner wall.

9. The appliance of claim 8, wherein the stop feature is a recess provided in a wall that defines the aperture.

10. The appliance of claim 5, wherein the housing comprises a cooperating stop feature for engagement with the inner wall when the housing is positioned correctly within the inner wall.

11. The appliance of claim 10, wherein the base of the housing comprises a strut adapted to extend into the aperture and the strut comprises the cooperating stop feature.

12. The appliance of claim 10, wherein the cooperating stop feature comprises a protrusion adapted to fit within the aperture.

13. The appliance of claim 11, wherein the strut extends between a pair of arms that extend from the base of the housing.

14. The appliance of claim 1, wherein the thermistor is electrically connected to a control circuit via wiring which extends within the housing.

15. The appliance of claim 14, wherein the wiring extends from the housing to a printed circuit board (PCB) and the wiring is connected to the PCB via a connector.

16. The appliance of claim 15, wherein the heater comprises a heater element and a wall which extends radially around the outer periphery of the heater element.

17. The appliance of claim 16, wherein the wiring extends along an outer periphery of the wall to the PCB.

18. The appliance of claim 16, wherein the inner wall comprises a pair of lips which extend around the inner wall at an end of the inner wall distal from the fluid outlet.

19. The appliance of claim 18, wherein the pair of lips is adapted to engage with the wall.

20. The appliance of claim 19, wherein the inner wall comprises at least one channel for accommodating the wiring, the at least one channel extending from an end of the inner wall distal from the fluid outlet.

21. The appliance of claim 20, wherein the at least one channel extends from an aperture in the inner wall wherein said aperture retains the housing within the inner wall.

22. The appliance of claim 15, wherein the PCB is housed within the body and between the PCB and the heater a baffle is provided.

23. The appliance of claim 22, wherein the baffle comprises a channel for guiding the wiring along a surface of the baffle.

24. The appliance of claim 23, wherein the baffle comprises a retaining clip for retaining the wiring within the channel.

25. The appliance of claim 24, wherein the retaining clip extends at least partially across the channel.

26. The appliance of claim 1, wherein the appliance is a hairdryer.

* * * * *